United States Patent
Ishii et al.

(10) Patent No.: US 10,014,463 B2
(45) Date of Patent: Jul. 3, 2018

(54) MULTILAYER PIEZOELECTRIC CERAMIC ELECTRONIC COMPONENT AND METHOD FOR MANUFACTURING MULTILAYER PIEZOELECTRIC CERAMIC ELECTRONIC COMPONENT

(71) Applicant: Murata Manufacturing Co., Ltd., Nagaokakyo-shi, Kyoto-fu (JP)

(72) Inventors: Hideki Ishii, Nagaokakyo (JP); Shinichiro Kawada, Nagaokakyo (JP); Hiroyuki Hayashi, Nagaokakyo (JP); Tadashi Okuzawa, Nagaokakyo (JP); Shoichiro Suzuki, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 373 days.

(21) Appl. No.: 15/016,365

(22) Filed: Feb. 5, 2016

(65) Prior Publication Data
US 2016/0155929 A1   Jun. 2, 2016

Related U.S. Application Data

(63) Continuation of application No. PCT/JP2014/075649, filed on Sep. 26, 2014.

(30) Foreign Application Priority Data

Sep. 30, 2013 (JP) ................. 2013-203722

(51) Int. Cl.
*H01L 41/187* (2006.01)
*H01L 41/43* (2013.01)
(Continued)

(52) U.S. Cl.
CPC ........ *H01L 41/1873* (2013.01); *C04B 35/495* (2013.01); *H01L 41/0471* (2013.01);
(Continued)

(58) Field of Classification Search
CPC ............. H01L 41/1873; H01L 41/0471; H01L 41/0477; H01L 41/277; H01L 41/273
See application file for complete search history.

(56) References Cited

U.S. PATENT DOCUMENTS

| 8,076,828 B2 | 12/2011 | Kawada |
| 2006/0046921 A1 | 3/2006 | Ito et al. |
| 2007/0001553 A1* | 1/2007 | Kawada ................ C04B 35/495 310/358 |
| 2007/0152183 A1* | 7/2007 | Furukawa ............. C04B 35/495 252/62.9 R |

(Continued)

FOREIGN PATENT DOCUMENTS

| CN | 1810713 A | 8/2006 |
| CN | 101679122 A | 3/2010 |

(Continued)

OTHER PUBLICATIONS

International Search Report issued for PCT/JP2014/075649, dated Dec. 9, 2014.

(Continued)

*Primary Examiner* — J. San Martin
(74) *Attorney, Agent, or Firm* — Arent Fox LLP

(57) ABSTRACT

A multilayer sintered body having alternately stacked Ni-based inner electrodes and piezoelectric ceramic layers. The piezoelectric ceramic layers contain a main ingredient of a perovskite compound containing Nb, K, Na, and Li, at least one element M1 selected from Nd and Dy, and at least one element M2 selected from Ga and Al. The element M2 content is 0.071 parts by mole or less per 1 part by mole of the Nb in a solution obtained through a dissolution process. This multilayer piezoelectric ceramic electronic component is manufactured through the cofiring of conductive films as a precursor of the inner electrodes and ceramic green sheets as a precursor of the piezoelectric ceramic layers in a reducing atmosphere in which the oxidation of Ni is inhibited.

19 Claims, 4 Drawing Sheets

(51) Int. Cl.
*H01L 41/047* (2006.01)
*H01L 41/273* (2013.01)
*C04B 35/495* (2006.01)
*H01L 41/277* (2013.01)

(52) U.S. Cl.
CPC ........ *H01L 41/0477* (2013.01); *H01L 41/273* (2013.01); *H01L 41/277* (2013.01); *H01L 41/43* (2013.01); *C04B 2235/3201* (2013.01); *C04B 2235/3203* (2013.01); *C04B 2235/3215* (2013.01); *C04B 2235/3217* (2013.01); *C04B 2235/3224* (2013.01); *C04B 2235/3225* (2013.01); *C04B 2235/3241* (2013.01); *C04B 2235/3244* (2013.01); *C04B 2235/3251* (2013.01); *C04B 2235/3262* (2013.01); *C04B 2235/3272* (2013.01); *C04B 2235/3286* (2013.01); *C04B 2235/6025* (2013.01); *C04B 2235/768* (2013.01)

(56) References Cited

U.S. PATENT DOCUMENTS

| | | | |
|---|---|---|---|
| 2010/0102679 | A1 | 4/2010 | Kawada |
| 2010/0103226 | A1 | 4/2010 | Sakashita et al. |

FOREIGN PATENT DOCUMENTS

| | | | |
|---|---|---|---|
| JP | 2004-359539 | A | 12/2004 |
| JP | 2008-195603 | A | 8/2008 |
| JP | 2010-095404 | A | 4/2010 |
| WO | WO 2008/152851 | A1 | 12/2008 |
| WO | WO 2010/050256 | A1 | 5/2010 |

OTHER PUBLICATIONS

Written Opinion of the International Searching Authority issued for PCT/JP2014/075649, dated Dec. 9, 2014.

\* cited by examiner

MULTILAYER PIEZOELECTRIC CERAMIC ELECTRONIC COMPONENT AND METHOD FOR MANUFACTURING MULTILAYER PIEZOELECTRIC CERAMIC ELECTRONIC COMPONENT

CROSS REFERENCE TO RELATED APPLICATIONS

The present application is a continuation of International application No. PCT/JP2014/075649, filed Sep. 26, 2014, which claims priority to Japanese Patent Application No. 2013-203722, filed Sep. 30, 2013, the entire contents of each of which are incorporated herein by reference.

FIELD OF THE INVENTION

The present invention relates to a multilayer piezoelectric ceramic electronic component and a method for manufacturing a multilayer piezoelectric ceramic electronic component, or more specifically a multilayer piezoelectric ceramic electronic component such as a multilayer piezoelectric actuator having Ni-based inner electrodes and a method for manufacturing it.

BACKGROUND OF THE INVENTION

Multilayer piezoelectric ceramic electronic components, such as multilayer piezoelectric actuators, offering a great displacement even at low voltage have been in growing demand in recent years.

The manufacture of a multilayer piezoelectric ceramic electronic component of this type usually involves alternately stacking piezoelectric ceramic layers and conductive layers as a precursor of inner electrodes and cofiring the obtained stack.

The inner electrodes are commonly made of Ag—Pd alloys, but Ag—Pd alloys are more expensive than non-precious metals. Furthermore, electronic components using such an alloy often experience electrochemical migration of Ag when operated in a low-frequency band or with DC voltage. It is therefore desirable to use a low-migration material.

In order for such electrochemical migration to be effectively prevented at low cost, it is preferred that the inner electrodes be made of a material based on Ni, a metal available at relatively low prices.

Ni is, however, easily oxidized when fired in an air atmosphere and needs to be fired in a reducing atmosphere. A piezoelectric material is therefore required that can be cofired in a reducing atmosphere.

As a solution to this, Patent Document 1 proposes a piezoelectric ceramic composition that contains a main ingredient represented by a general formula $\{(1-x)(K_{1-a-b}Na_aLi_b)(Nb_{1-c}Ta_c)O_3-xM2M4O_3\}$ (where M2 represents at least one of Ca, Ba, and Sr, M4 represents at least one of Zr, Sn, and Hf, and x, a, b, and c meet the following conditions: $0.005 \leq x \leq 0.1$, $0 \leq a \leq 0.9$, $0 \leq b \leq 0.1$, $0 \leq a+b \leq 0.9$, and $0 \leq c \leq 0.3$) and 2 to 15 moles of Mn per 100 moles of the main ingredient, with the M4 content in the range of 0.1 to 5.0 moles per 100 moles of the main ingredient.

According to Patent Document 1, the above constitution makes a piezoelectric ceramic composition more sinterable in a reducing atmosphere, allowing the ceramic composition to be completely sintered even if cofired with a Ni-based inner electrode material in a reducing atmosphere. As a result, a piezoelectric ceramic electronic component is obtained with good piezoelectricity.

Patent Document 1: International Publication No. 2008/152851 (claims 1 and [0024])

SUMMARY OF THE INVENTION

The inventors, however, found that even a piezoelectric ceramic electronic component according to Patent Document 1 can experience a loss of specific resistance damaging to its reliability when used for a long period of time in an application in which a high level of direct-current voltage, such as for actuators, is needed. Piezoelectric ceramic electronic components according to Patent Document 1 are therefore unsuitable for applications in which a certain degree of reliability is required.

The present invention, made under these circumstances, is intended to provide a multilayer piezoelectric ceramic electronic component that combines practical piezoelectricity and high reliability and a method for manufacturing a multilayer piezoelectric ceramic electronic component.

After extensive research to attain this object, the inventors reached the understanding that a perovskite-structured alkali metal niobate compound that contains at least one element selected from Nd and Dy and a predetermined amount of at least one element selected from Ga and Al combines practical piezoelectricity and high reliability even when cofired with a Ni-based inner electrode material in a reducing atmosphere.

The present invention is based on this understanding. A multilayer piezoelectric ceramic electronic component according to the present invention includes a multilayer sintered body composed of Ni-based inner electrodes and piezoelectric ceramic layers alternately stacked and sintered in a reducing atmosphere. The piezoelectric ceramic layers contain a perovskite compound containing Nb, K, Na, and Li, at least one element M1 selected from Nd and Dy, and at least one element M2 selected from Ga and Al, the perovskite compound being the main ingredient. The element M2 content is 0.071 parts by mole or less per 1 part by mole of the Nb in a solution obtained through a dissolution process.

Another multilayer piezoelectric ceramic electronic component according to the present invention includes a multilayer sintered body composed of Ni-based inner electrodes and piezoelectric ceramic layers alternately stacked and sintered in a reducing atmosphere. The piezoelectric ceramic layers contain a perovskite compound containing Nb, K, Na, and Li, at least one element M1 selected from Nd and Dy, and at least one element M2 selected from Ga and Al, the perovskite compound being the main ingredient. The element M2 content is 0.071 parts by mole or less per 1 part by mole of the Nb.

A further multilayer piezoelectric ceramic electronic component according to the present invention includes a multilayer sintered body composed of Ni-based inner electrodes and piezoelectric ceramic layers alternately stacked and sintered in a reducing atmosphere. The multilayer sintered body contains a perovskite compound containing Nb, K, Na, and Li, at least one element M1 selected from Nd and Dy, and at least one element M2 selected from Ga and Al, the perovskite compound being the main ingredient. The element M2 content is 0.071 parts by mole or less per 1 part by mole of the Nb.

Yet another multilayer piezoelectric ceramic electronic component according to the present invention includes a multilayer sintered body composed of Ni-based inner electrodes and piezoelectric ceramic layers alternately stacked and sintered in a reducing atmosphere and outer electrodes on the surface of the multilayer sintered body. The multilayer piezoelectric ceramic electronic component contains a perovskite compound containing Nb, K, Na, and Li, at least one element M1 selected from Nd and Dy, and at least one element M2 selected from Ga and Al, the perovskite compound being the main ingredient. The element M2 content is 0.071 parts by mole or less per 1 part by mole of the Nb.

For a multilayer piezoelectric ceramic electronic component according to the present invention, it is preferred that the element M2 content be 0.002 parts by mole or more per 1 part by mole of the Nb.

For a multilayer piezoelectric ceramic electronic component according to the present invention, furthermore, it is preferred that the element M1 content be 0.002 parts by mole or more and 0.071 parts by mole or less per 1 part by mole of the Nb.

For the present invention, it is also preferred that predetermined amounts of Mn, Ba, and/or Zr be optionally contained. Even this does not cause a loss of piezoelectricity, but rather leads to high reliability to be achieved in a more stable manner.

To be more specific, for a multilayer piezoelectric ceramic electronic component according to the present invention, it is preferred that the piezoelectric ceramic layers contain Mn with the Mn content being 0.154 parts by mole or less per 1 part by mole of the Nb.

For a multilayer piezoelectric ceramic electronic component according to the present invention, it is preferred that the piezoelectric ceramic layers contain Ba with the Ba content being 0.063 parts by mole or less per 1 part by mole of the Nb.

For a multilayer piezoelectric ceramic electronic component according to the present invention, it is preferred that the piezoelectric ceramic layers contain Zr with the Zr content being 0.088 parts by mole or less per 1 part by mole of the Nb.

A method according to the present invention for manufacturing a multilayer piezoelectric ceramic electronic component includes an apportioning step, a green sheet production step, a conductive film formation step, a shaping step, and a firing step. The apportioning step includes preparing ceramic raw materials including a Na compound, a K compound, a Li compound, a Nb compound, at least one compound selected from a Nd compound and a Dy compound, and at least one compound selected from a Ga compound and an Al compound and weighing out such amounts of the ceramic raw materials that the post-firing quantity of at least one element of Ga and Al will be 0.071 parts by mole or less per 1 part by mole of Nb. The green sheet production step includes producing ceramic green sheets from the ceramic raw materials as starting materials. The conductive film formation step includes applying a Ni-based conductive paste to the ceramic green sheets to form conductive films in a predetermined pattern. The shaping step includes stacking the ceramic green sheets, with the conductive films thereon, in a predetermined order to produce a multilayer article. The firing step includes firing the multilayer article to produce a multilayer sintered body. In the firing step, the ceramic green sheets and the conductive paste are cofired in a reducing atmosphere in which the oxidation of the conductive films is inhibited.

In the various multilayer piezoelectric ceramic electronic components according to the present invention, the combined effects of the addition of the elements M1 and M2 give the electronic component practical piezoelectricity and desired high reliability.

Since the specification for the element M2 content is based on the quantity per 1 part by mole of Nb, the element M2 content per 1 part by mole of Nb is the same even in the piezoelectric ceramic layers, the multilayer sintered body as an alternate stack of inner electrodes and the piezoelectric ceramic layers, and the multilayer piezoelectric ceramic electronic component as a finished article. The aforementioned advantages are therefore provided.

In a method according to the present invention for manufacturing a multilayer piezoelectric ceramic electronic component, the ceramic raw materials are weighed out in such amounts that the post-firing quantity of at least one element of Ga and Al will be 0.071 parts by mole or less per 1 part by mole of Nb. Then the multilayer article obtained through the steps of green sheet production, conductive film formation, and shaping is fired in a reducing atmosphere in which the oxidation of the conductive films is inhibited. The resulting multilayer piezoelectric ceramic electronic component is highly reliable despite cofiring with a Ni-based inner electrode material in a reducing atmosphere.

DETAILED DESCRIPTION OF THE PREFERRED EMBODIMENTS

Figure 1:
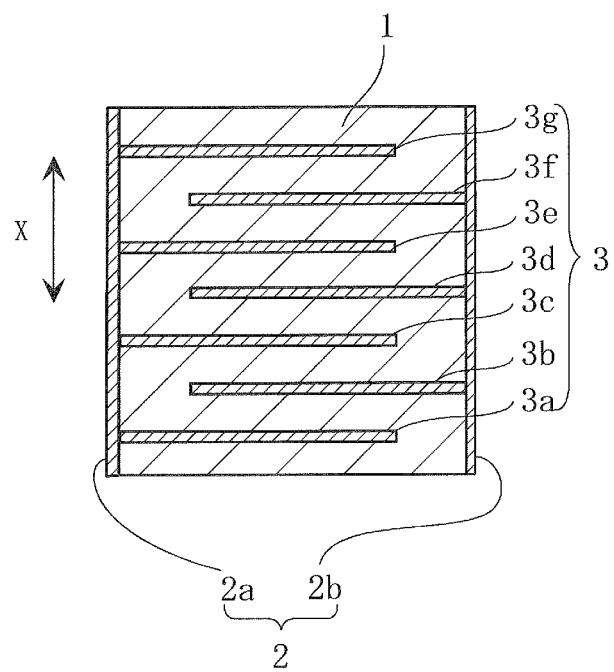
FIG. 1 is a cross-sectional diagram illustrating an embodiment of a multilayer piezoelectric ceramic electronic component according to the present invention.

FIG. 1 is a cross-sectional diagram illustrating an embodiment of a multilayer piezoelectric ceramic electronic component according to the present invention.

This multilayer piezoelectric ceramic electronic component includes a multilayer sintered body 1 and outer electrodes 2 (2a and 2b) made of a conductive material such as Ag on the end portions of the multilayer sintered body 1. The multilayer sintered body 1 is a sintered form of alternately stacked piezoelectric ceramic layers and inner electrodes 3 (3a to 3g) made of a Ni-based conductive material.

The inner electrodes 3a, 3c, 3e, and 3g of the multilayer sintered body 1 are electrically coupled to one outer electrode 2a at one end thereof, and the inner electrodes 3b, 3d, and 3f are electrically coupled to the other outer electrode 2b at one end thereof. When voltage is applied across the outer electrodes 2a and 2b, the multilayer piezoelectric ceramic electronic component is displaced in the direction of stacking, indicated by arrow X, as a result of a longitudinal piezoelectric effect.

In this embodiment, the piezoelectric ceramic layers as a structural element of the multilayer sintered body 1 contain a perovskite compound containing Nb, K, Na, and Li, at least one element M1 selected from Nd and Dy, and at least one element M2 selected from Ga and Al, the perovskite compound being the main ingredient, and the element M2 content is 0.071 parts by mole or less per 1 part by mole of the Nb in a solution obtained through a dissolution process.

To be more specific, the piezoelectric ceramic composition of which the piezoelectric ceramic layers are made can be described using general formula (A).

$$100(K,Na,Li)NbO_3 + xM1O_{3/2} + yM2O_{3/2} \quad (A)$$

In other words, the main ingredient of the piezoelectric ceramic layers is a perovskite crystal-structured alkali niobate compound with the A site formed by alkali metals (K, Na, and Li) and the B site by Nb.

The element M1 represents at least one element selected from Nd and Dy, and the element M2 represents at least one element selected from Ga and Al. x represents the number of parts by mole of $M1O_{3/2}$ per 100 parts by mole of the Nb in the main ingredient, and y represents the number of parts by mole of $M2O_{3/2}$ per 100 parts by mole of the Nb in the main ingredient.

The element M2 content in general formula (A) is per 100 parts by mole of Nb. When based on each part by mole of Nb, the element M2 content is 0.071 parts by mole or less.

The constitution of the piezoelectric ceramic composition represented by general formula (A) can be quantitatively analyzed using an ICP-AES (inductive coupling plasma-atomic emission spectroscope) or similar measuring instrument. The outer electrodes 2a and 2b are removed from the multilayer piezoelectric ceramic electronic component as a finished article, and the resulting article is dissolved through a dissolution process using an acid or similar. The obtained solution is subjected to the analysis.

The following describes the reason for the above structure of the piezoelectric ceramic layers in detail.

When a known piezoelectric ceramic electronic component based on an alkali niobate compound is subjected to a direct-current voltage across the outer electrodes 2a and 2b, defects are formed in the crystal lattices due to the movement of oxygen. This appears to be the cause of impaired reliability behavior and the resulting loss of reliability.

After extensive research by trial and error on the addition of elements M1 and M2 to (K, Na, Li)NbO₃ as the main ingredient, the inventors found that the multilayer piezoelectric ceramic electronic component is highly reliable when the piezoelectric ceramic layers contain, in addition to the element M1, 0.071 parts by mole or less of the element M2 per 1 part by mole of Nb.

The inventors speculate that the reason for this high reliability is as follows.

A possible cause of the loss of reliability that occurs when direct-current voltage is applied across the outer electrodes 2a and 2b for a long period of time can be as follows. As mentioned above, the application of direct-current voltage makes oxygen vacancies in the crystal lattice migrate, leaving defects. The defects lead to lowered resistance of the piezoelectric ceramic layers in some portions. A large amount of electric field concentrates except at the low-resistance portions, and the piezoelectric ceramic layers cannot withstand this large amount of electric field and are finally broken.

When the trivalent element M1, Nd and/or Dy, is added to the main ingredient, the element M1 preferentially settles at the A site, the site for alkali metals, rather than the B site, the site for Nb, in the solid solution because of its ionic radius. This situation makes lattice strains, or distorts more likely because of the difference in ionic radius between the alkali metals at the A site and the element M1, restraining oxygen atoms from moving. The local lowering of the resistance of the ceramic layers is thus prevented, and the reliability for the voltage applied is improved.

Adding the element M1, however, can lead to a loss of sinterability because the large difference in valence between the trivalent element M1 and the monovalent alkali metals prevents the element from taking the A site in the solid solution.

Thus a predetermined amount of a trivalent element that can exist at the B site in the solid solution, namely the element M2, is added together with the element M1 to compensate for the difference in valence between the element M1 and the alkali metals.

To be more specific, the element M2, Ga and/or Al, has an ionic radius that allows settlement at the B site in the solid solution and possesses a valence of three. The element M2 therefore preferentially takes the B site rather than the A site in the solid solution. This compensates for the difference in valence between the element M1 and the alkali metals, accelerating the settlement of the element M1 at the A site, thereby improving reliability without loss of sinterability.

It is not preferred to make the element M2 content more than 0.071 parts by mole per 1 part by mole of Nb because this actually affects sinterability. The element M2 content therefore needs to be 0.071 parts by mole or less per 1 part by mole of Nb, preferably 0.002 parts by mole or more and 0.071 parts by mole or less.

The element M1 content is not limited. It is preferred that the element M1 content be in the range of 0.002 to 0.071 parts by mole per 1 part by mole of Nb.

The elements M1 and M2 have the aforementioned effects seemingly when forming a solid solution with the main ingredient in the way described above. However, part of the elements M1 and M2 may be segregated in grain boundaries or triple points, as long as part of these elements forms a solid solution with the main ingredient.

Furthermore, as long as an alkali niobate compound is used as the main ingredient with the element M2 in an amount of 0.071 parts by mole or less per 1 part by mole of Nb in addition to the element M1, it would be preferred that supplementary ingredients such as Mn, Ba, and Zr be optionally contained.

In other words, adding Mn, Ba, and/or Zr to the main ingredient improves sinterability in a reducing atmosphere and contributes to increasing reliability.

When these ingredients are used, the piezoelectric ceramic composition of which the piezoelectric ceramic layers are made can be described using general formula (B).

$$100(K,Na,Li)NbO_3 + xM1O_{3/2} + yM2O_{3/2} + zMnO + uBaO + vZrO_2 \quad (B)$$

z represents the Mn content per 100 parts by mole of Nb in the main ingredient, u represents the Ba content per 100 parts by mole of the Nb, and v represents the Zr content per 100 parts by mole of Nb.

It is not preferred to add excessive amounts of Mn, Ba, and/or Zr because this can affect piezoelectricity.

To be more specific, an excessively high Mn content exceeding 0.154 parts by mole per 1 part by mole of Nb can lead to a loss of piezoelectricity.

An excessively high Ba content exceeding 0.063 parts by mole per 1 part by mole of Nb can lead to a loss of piezoelectricity.

An excessively high Zr content exceeding 0.088 parts by mole per 1 part by mole of Nb can lead to a loss of piezoelectricity.

In summary, the presence of supplementary ingredients such as Mn, Ba, and Zr in the piezoelectric ceramic layers is not essential for improving reliability, but adding Mn, Ba, and/or Zr leads to enhanced reliability. If Mn, Ba, and/or Zr are contained, it is required for the sake of piezoelectricity that Mn be 0.154 parts by mole or less, Ba be 0.063 parts by mole or less, and Zr be 0.088 parts by mole or less, all per 1 part by mole of Nb.

The following describes a method for manufacturing this multilayer piezoelectric ceramic electronic component in detail.

First, the following ceramic raw materials are prepared: alkali metal compounds each containing Na, K, or Li, a Nb compound containing Nb, an M1 compound containing an element M1, and an M2 compound containing an element M2, optionally with a Mn compound containing Mn, a Ba compound containing Ba, and a Zr compound containing Zr. The compounds can be in the form of an oxide, a carbonate, or a hydroxide.

The alkali metal compounds, the Nb compound, the M1 compound, and the M2 compound are then weighed out in such amounts that the post-firing element M2 content will be 0.071 parts by mole or less per 1 part by mole of Nb. Predetermined amounts of the Mn compound, the Ba compound, and the Zr compound are optionally weighed out. The apportioned materials are put into a ball mill together with a milling medium such as PSZ (partially stabilized zirconia) balls and thoroughly wet-milled in the presence of a solvent such as ethanol to form a mixture.

The mixture is dried and then calcined for synthesis at, for example, 850° C. to 900° C. in an air atmosphere. This yields calcined material.

The calcined material is disintegrated and wet-mixed in a ball mill together with an organic binder and a dispersant in the presence of a dispersion medium such as purified water, forming ceramic slurry. The ceramic slurry is shaped into ceramic green sheets using a doctor blade or any similar method.

Figure 2:
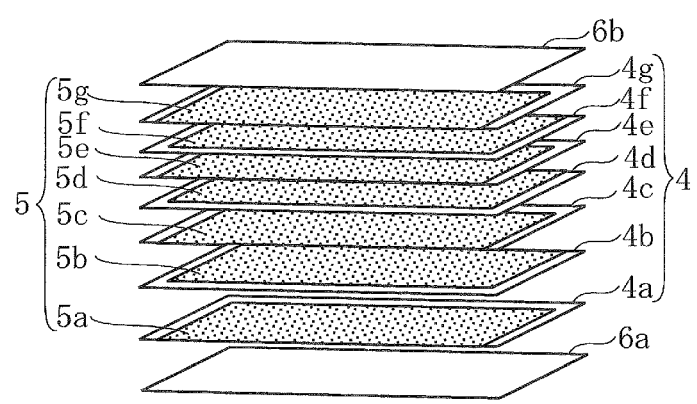
FIG. 2 is an exploded perspective view of a multilayer article obtained in the course of manufacturing a multilayer piezoelectric ceramic electronic component according to the present invention.

Then a Ni-based conductive paste for inner electrodes is applied to the ceramic green sheets 4 (4a to 4g) using screen printing, forming conductive films 5 (5a to 5g) as illustrated in FIG. 2.

The ceramic green sheets 4a to 4g, with the conductive films 5a to 5g thereon, are stacked and held between ceramic green sheets 6a and 6b, on which the conductive films 5a to 5g have not been formed, and pressure-bonded. This produces a multilayer article in which the conductive films 5a to 5g and the ceramic green sheets 4a to 4g are alternately stacked. The multilayer article is cut into a predetermined size, and the workpiece is placed in a sagger made of alumina. After debinding at, for example, 250° C. to 500° C., the workpiece is fired at a predetermined temperature of 1000° C. to 1100° C. in a reducing atmosphere in which the oxidation of Ni is inhibited. Through this, a multilayer sintered body 1 is formed as an alternate stack of inner electrodes 3a to 3g and piezoelectric ceramic layers.

Figure 3:
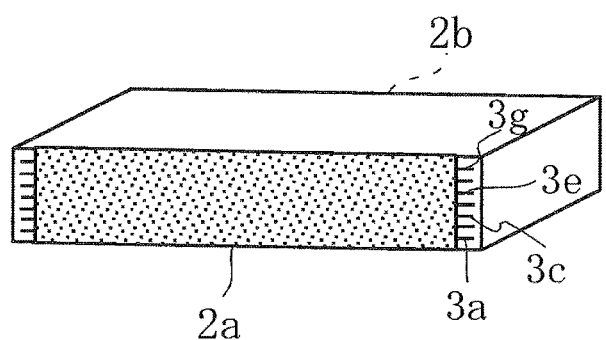
FIG. 3 is a perspective view of a multilayer piezoelectric ceramic electronic component according to the present invention.

A conductive paste for outer electrodes, a paste of Ag or similar, is then applied to both end portions of the multilayer sintered body 1 and fired at a predetermined temperature of 750° C. to 850° C. to form outer electrodes 2a and 2b as illustrated in FIG. 3, followed by a predetermined poling process. In this way, a multilayer piezoelectric ceramic is manufactured. The outer electrodes 2a and 2b only need to be in close contact and may be formed using a thin-film formation method such as sputtering or vacuum deposition.

As seen from the foregoing, this method for manufacturing a multilayer piezoelectric ceramic electronic component includes an apportioning step, a green sheet production step, a conductive film formation step, a shaping step, and a firing step. The apportioning step includes preparing ceramic raw materials including a Na compound, a K compound, a Li compound, a Nb compound, at least one compound selected from a Nd compound and a Dy compound, and at least one compound selected from a Ga compound and an Al compound and weighing out such amounts of the ceramic raw materials that the post-firing quantity of at least one element of Ga and Al will be 0.071 parts by mole or less per 1 part by mole of Nb. The green sheet production step includes producing ceramic green sheets from the ceramic raw materials as starting materials. The conductive film formation step includes applying a Ni-based conductive paste to the ceramic green sheets to form conductive films in a predetermined pattern. The shaping step includes stacking the ceramic green sheets, with the conductive films thereon, in a predetermined order to produce a multilayer article. The firing step includes firing the multilayer article to produce a multilayer sintered body. In the firing step, the ceramic green sheets and the conductive paste are cofired in a reducing atmosphere in which the oxidation of the conductive films is inhibited. The resulting multilayer piezoelectric ceramic electronic component combines practical piezoelectricity and high reliability despite the cofiring of ceramic green sheets and Ni-based conductive films in a reducing atmosphere.

The present invention is not limited to the above embodiments. For example, one of the above embodiments includes constitutional analysis on a sample extracted in a solution obtained through a dissolution process, but even if the sample is from the piezoelectric ceramic layers, the multilayer sintered body as an alternate stack of inner electrodes and the piezoelectric ceramic layers, or the multilayer piezoelectric ceramic electronic component as a finished article, the element M2 content per 1 part by mole of Nb is the same and the aforementioned advantages are provided because the specification for the element M2 content is based on the quantity per 1 part by mole of Nb.

The main ingredient can be any compound classified as an alkali niobate compound. The aforementioned advantages are provided even if part of Nb is substituted with Ta.

In the above embodiments the element M1 is Nd and/or Dy, but the only requirement is that Nd and/or Dy is contained. This means that, for example, part of Nd or Dy may be substituted with a rare earth metal for which the difference between the ionic radius of K and Na and that of Nd and Dy is comparable or greater, such as Sc, In, Y, Eu, Gd, Sm, Ho, Er, or Tb.

In the above embodiments the element M2 is Ga and/or Al, but the only requirement is that Ga and/or Al is contained. This means that part of Ga or Al may be substituted with a trivalent element having an ionic radius that allows settlement at the B site in the solid solution, such as Cr or Fe.

The following is a specific description of some examples of the present invention.

EXAMPLES

First, the following ceramic raw materials were prepared: $K_2CO_3$, $Na_2CO_3$, $Li_2CO_3$, $Nb_2O_5$, $BaCO_3$, $ZrO_2$, $MnCO_3$, $Dy_2O_3$, $Nd_2O_3$, $Ga_2O_3$, and $Al_2O_3$.

The ceramic raw materials were then weighed out in such amounts that M1, M2, x, y, z, u, and v in the general formula [$100(K_{0.49}Na_{0.49}Li_{0.02})NbO_3+xM1O_{3/2}+yM2O_{3/2}+zMnO+uBaO+vZrO_2$] were as in the formula in Table 1.

The apportioned materials were put into a ball mill together with PSZ balls and thoroughly wet-mixed with ethanol as a dispersion medium. The obtained mixture was dried and then calcined in an air atmosphere at a temperature of 850° C. for 2 hours, yielding calcined material.

The calcined material was disintegrated, put into a ball mill together with a binder, a dispersant, and purified water, and thoroughly wet-mixed with them. The obtained mixture was shaped using a doctor blade into 120-μm-thick ceramic green sheets.

Then a Ni-based conductive paste was prepared, and the conductive paste was applied to the ceramic green sheets using screen printing to form conductive films in a predetermined pattern.

The ceramic green sheets, with the conductive films thereon, were then stacked in a predetermined order and pressure-bonded with a pressure of 25 MPa. The resulting article was fired at a temperature of 1000° C. to 1100° C. for 2 hours in a reducing atmosphere in which the oxidation of Ni was inhibited (sample numbers 1 to 23 and 26 to 32) or in an air atmosphere (sample numbers 24, 25, and 33), producing a multilayer sintered body as an alternate stack of piezoelectric ceramic layers and inner electrodes.

The multilayer sintered body was cut using a dicer in such a manner as to make the inner electrodes exposed alternately on each end face of the multilayer sintered body. A Ni—Cr alloy and Ni—Cu alloy bilayer outer electrode was then formed on each end face using sputtering. In this way, samples of sample numbers 1 to 33 were obtained. The outer dimensions of each sample were 8.0 mm long, 2.0 mm wide, and 1.0 mm thick. The number of layers was 11.

[Evaluation of Samples]

Each of the samples of sample numbers 1 to 33 was subjected to a poling process in which the sample was exposed to an electric field of 3.0 kV/mm for 10 minutes at room temperature. The lateral displacement S of the device was measured using a laser Doppler vibrometer with electric fields from 0.5 to 11 kV/mm and at a measurement frequency of 1 kHz. The displacement S was divided by the width of the device (2.0 mm) to give the strain, which was then divided by the electric fields E to give S/E values. The maximum S/E value, $S_{max}/E_{max}$, was used to evaluate displacement characteristics.

Furthermore, each of the samples of sample numbers 1 to 33 was put into a temperature-controlled bath at 85° C. and exposed to a DC electric field of 2 kV/mm. At the time points of 1 hour, 24 hours, 100 hours, 200 hours, 300 hours, 400 hours, and 500 hours, the sample was taken out of the bath and the specific resistance was measured. The time point at which the specific resistance became $10^3$ Ω·cm or less was defined as the DC electric-field reliability life.

For each of the samples of sample numbers 1 to 33, the multilayer sintered body was dissolved in acid after removal of the outer electrodes, and the solution was subjected to a constitutional analysis using an ICP-AES (inductive coupling plasma-atomic emission spectroscopy).

Table 1 summarizes the formula of ingredients and firing atmosphere for sample numbers 1 to 33. Table 2 summarizes the number of parts by mole of each ingredient per 1 part by mole of Nb, the Smax/Emax, and the reliability life.

TABLE 1

| Sample No. | \multicolumn{7}{c}{$100(K_{0.49}Na_{0.49}Li_{0.02})NbO_3 + xM1O_{3/2} + yM2O_{3/2} + zMnO + uBaO + vZrO_2$} |
|---|---|---|---|---|---|---|---|---|
| | M1 | M2 | x | y | z | u | v | Firing atmosphere |
| 1*[1] | — | — | 0 | 0 | 5 | 3.5 | 5 | Reducing atmosphere |
| 2*[1] | Nd | — | 1 | 0 | 5 | 3.5 | 5 | Reducing atmosphere |
| 3*[1] | Dy | — | 1 | 0 | 5 | 3.5 | 5 | Reducing atmosphere |
| 4*[1] | — | Ga | 0 | 1 | 5 | 3.5 | 5 | Reducing atmosphere |
| 5 | Dy | Ga | 1 | 1 | 5 | 3.5 | 5 | Reducing atmosphere |
| 6 | Nd | Ga | 1 | 1 | 5 | 3.5 | 5 | Reducing atmosphere |
| 7 | Nd | Ga | 1 | 1 | 5 | 0 | 0 | Reducing atmosphere |
| 8 | Nd | Ga | 1 | 1 | 5 | 0 | 1.5 | Reducing atmosphere |
| 9 | Nd | Ga | 1 | 1 | 5 | 6 | 7.5 | Reducing atmosphere |
| 10*[3] | Nd | Ga | 1 | 1 | 5 | 6.5 | 8 | Reducing atmosphere |
| 11 | Nd | Ga | 1 | 1 | 5 | 3.5 | 3.5 | Reducing atmosphere |
| 12 | Nd | Ga | 1 | 1 | 5 | 3.5 | 8.5 | Reducing atmosphere |
| 13*[4] | Nd | Ga | 1 | 1 | 5 | 3.5 | 9 | Reducing atmosphere |
| 14 | Nd | Ga | 1 | 1 | 0 | 3.5 | 5 | Reducing atmosphere |
| 15 | Nd | Ga | 1 | 1 | 1.5 | 3.5 | 5 | Reducing atmosphere |
| 16 | Nd | Ga | 1 | 1 | 15 | 3.5 | 5 | Reducing atmosphere |
| 17*[2] | Nd | Ga | 1 | 1 | 17 | 3.5 | 5 | Reducing atmosphere |
| 18 | Nd | Ga | 0.2 | 0.2 | 5 | 3.5 | 5 | Reducing atmosphere |
| 19 | Nd | Ga | 5 | 5 | 5 | 3.5 | 5 | Reducing atmosphere |
| 20*[1] | Nd | Ga | 7 | 7 | 5 | 3.5 | 5 | Reducing atmosphere |
| 21 | Nd | Ga | 0.5 | 0.5 | 5 | 3.5 | 5 | Reducing atmosphere |
| 22 | Nd | Ga | 0.5 | 1 | 5 | 3.5 | 5 | Reducing atmosphere |
| 23 | Nd | Ga | 1 | 0.5 | 5 | 3.5 | 5 | Reducing atmosphere |
| 24*[1] | Nd | Ga | 1 | 1 | 5 | 3.5 | 5 | Air atmosphere |
| 25*[1] | — | — | 0 | 0 | 5 | 3.5 | 5 | Air atmosphere |
| 26 | Nd | Ga | 6.8 | 6.8 | 5 | 3.5 | 5 | Reducing atmosphere |
| 27 | Nd | Al | 0.2 | 0.2 | 5 | 3.5 | 5 | Reducing atmosphere |
| 28 | Nd | Al | 1 | 1 | 5 | 3.5 | 5 | Reducing atmosphere |
| 29 | Nd | Al | 5 | 5 | 5 | 3.5 | 5 | Reducing atmosphere |
| 30 | Nd | Al | 7 | 7 | 5 | 3.5 | 5 | Reducing atmosphere |
| 31*[1] | Nd | Al | 7.5 | 7.5 | 5 | 3.5 | 5 | Reducing atmosphere |
| 32 | Nd | Ga/Al (=1/1) | 1 | 1 | 5 | 3.5 | 5 | Reducing atmosphere |
| 33*[1] | Nd | Al | 1 | 1 | 5 | 3.5 | 5 | Air atmosphere |

*[1] Out of the scope of Claim 1.
*[2] Out of the scope of Claim 7.
*[3] Out of the scope of Claim 8.
*[4] Out of the scope of Claim 9.

TABLE 2

| Sample No. | Parts by mole per 1 part by mole of Nb | | | | | $S_{max}/E_{max}$ (pm/V) | Reliability life (h) |
|---|---|---|---|---|---|---|---|
| | M1 | M2 | Mn | Ba | Zr | | |
| 1*[1] | 0.000 | 0.000 | 0.051 | 0.036 | 0.053 | 120 | 24 |
| 2*[1] | 0.011 | 0.000 | 0.052 | 0.035 | 0.051 | — | — |
| 3*[1] | 0.011 | 0.000 | 0.051 | 0.036 | 0.052 | — | — |
| 4*[1] | 0.000 | 0.011 | 0.051 | 0.037 | 0.054 | 7 | 24 |
| 5 | 0.012 | 0.010 | 0.052 | 0.036 | 0.054 | 62 | 500 |
| 6 | 0.010 | 0.011 | 0.053 | 0.036 | 0.052 | 48 | >500 |
| 7 | 0.011 | 0.012 | 0.051 | 0.000 | 0.000 | 30 | 400 |
| 8 | 0.011 | 0.011 | 0.052 | 0.000 | 0.017 | 33 | 500 |
| 9 | 0.010 | 0.010 | 0.051 | 0.063 | 0.079 | 31 | >500 |
| 10*[3] | 0.012 | 0.011 | 0.052 | 0.067 | 0.083 | 10 | >500 |
| 11 | 0.010 | 0.010 | 0.051 | 0.038 | 0.039 | 34 | 400 |
| 12 | 0.010 | 0.010 | 0.052 | 0.036 | 0.088 | 30 | 500 |
| 13*[4] | 0.011 | 0.010 | 0.050 | 0.035 | 0.091 | 19 | 400 |
| 14 | 0.011 | 0.012 | 0.000 | 0.037 | 0.053 | 32 | 300 |
| 15 | 0.010 | 0.012 | 0.016 | 0.035 | 0.050 | 41 | 400 |
| 16 | 0.012 | 0.011 | 0.154 | 0.035 | 0.052 | 31 | 300 |
| 17*[2] | 0.010 | 0.010 | 0.169 | 0.036 | 0.051 | 17 | 300 |
| 18 | 0.003 | 0.002 | 0.051 | 0.037 | 0.054 | 97 | 300 |
| 19 | 0.050 | 0.051 | 0.050 | 0.036 | 0.052 | 36 | 500 |
| 20*[1] | 0.072 | 0.073 | 0.051 | 0.036 | 0.051 | — | — |
| 21 | 0.005 | 0.005 | 0.052 | 0.038 | 0.053 | 65 | >500 |
| 22 | 0.004 | 0.011 | 0.052 | 0.036 | 0.053 | 67 | >500 |
| 23 | 0.012 | 0.005 | 0.050 | 0.035 | 0.051 | 44 | >500 |
| 24*[1] | 0.011 | 0.009 | 0.051 | 0.037 | 0.051 | — | — |
| 25*[1] | 0.000 | 0.000 | 0.050 | 0.037 | 0.051 | — | — |
| 26 | 0.070 | 0.071 | 0.049 | 0.035 | 0.054 | 31 | 300 |

TABLE 2-continued

| Sample No. | Parts by mole per 1 part by mole of Nb | | | | | $S_{max}/E_{max}$ (pm/V) | Reliability life (h) |
|---|---|---|---|---|---|---|---|
| | M1 | M2 | Mn | Ba | Zr | | |
| 27 | 0.002 | 0.002 | 0.049 | 0.034 | 0.053 | 88 | 300 |
| 28 | 0.012 | 0.011 | 0.052 | 0.035 | 0.051 | 44 | >500 |
| 29 | 0.050 | 0.050 | 0.048 | 0.034 | 0.051 | 33 | 500 |
| 30 | 0.071 | 0.070 | 0.049 | 0.036 | 0.052 | 30 | 300 |
| 31*[1] | 0.075 | 0.074 | 0.050 | 0.036 | 0.051 | — | — |
| 32 | 0.009 | Ga: 0.005 Al: 0.005 | 0.051 | 0.035 | 0.050 | 45 | >500 |
| 33*[1] | 0.011 | 0.010 | 0.053 | 0.037 | 0.050 | — | — |

*[1])Out of the scope of Claim 1.
*[2])Out of the scope of Claim 7.
*[3])Out of the scope of Claim 8.
*[4])Out of the scope of Claim 9.

For sample number 1, the piezoelectric ceramic layers contained neither the element M1 nor the element M2. The Smax/Emax was 120 μm/V indicating good displacement characteristics, but the reliability life was 24 hours indicating low reliability.

For sample numbers 2 and 3, the element M1 was contained but the element M2 was not. The temperature of 1000° C. to 1100° C. was not sufficient for complete sintering, and the measurement of displacement characteristics and reliability life was impossible.

For sample number 4, the element M2 was contained but the element M1 was not. The Smax/Emax was 7 μm/V indicating poor displacement characteristics, and the reliability life was 24 hours indicating low reliability.

For sample number 20, both elements M1 and M2 were contained but the element M2 content was excessively high, 0.073 parts by mole per 1 part by mole of Nb. The temperature of 1000° C. to 1100° C. was not sufficient for complete sintering, and the measurement of displacement characteristics and reliability life was impossible.

For sample number 31, likewise, both elements M1 and M2 were contained but the element M2 content was excessively high, 0.074 parts by mole per 1 part by mole of Nb. The measurement of displacement characteristics and reliability life was impossible because of incomplete sintering, as was the case for sample number 20.

For sample numbers 24, 25, and 33, firing in an air atmosphere led to the oxidation of Ni, the main ingredient of the inner electrodes. This made the measurement of displacement characteristics and reliability life impossible.

For sample numbers 5 to 19, 21 to 23, 26 to 30, and 32, both elements M1 and M2 were contained, and the element M2 content was 0.071 parts by mole or less per 1 part by mole of Nb. As a result, the reliability life was at least 300 hours indicating high reliability.

For sample number 10, however, the Ba content was excessively high, 0.067 parts by mole per 1 part by mole of Nb. The Smax/Emax was 10 μm/V indicating reduced displacement characteristics. That is, as can be seen from sample number 8, an Smax/Emax of 30 μm/V or more can be achieved without Ba as long as the elements M1 and M2 are contained with the element M2 content being 0.071 part by mole or less per 1 part by mole of Nb. If the Ba content exceeds 0.063 parts by mole per 1 part by mole of Nb, however, reliability remains high but displacement characteristics are reduced. It is therefore preferred that the quantity of Ba, if contained, be 0.063 parts by mole or less per 1 part by mole of Nb.

For sample number 13, the Zr content was excessively high, 0.091 parts by mole per 1 part by mole of Nb. The Smax/Emax was 19 μm/V indicating reduced displacement characteristics. That is, as can be seen from sample number 7, an Smax/Emax of 30 μm/V or more can be achieved without Zr as long as the elements M1 and M2 are contained with the element M2 content being 0.071 part by mole or less per 1 part by mole of Nb. If the Zr content exceeds 0.088 parts by mole per 1 part by mole of Nb, however, reliability remains high but displacement characteristics are reduced. It is therefore preferred that the quantity of Zr, if contained, be 0.088 parts by mole or less per 1 part by mole of Nb.

For sample number 17, furthermore, the Mn content was excessively high, 0.169 parts by mole per 1 part by mole of Nb. The Smax/Emax was 17 μm/V indicating reduced displacement characteristics. That is, as can be seen from sample number 14, an Smax/Emax of 30 μm/V or more can be achieved without Mn as long as the elements M1 and M2 are contained with the element M2 content being 0.071 part by mole or less per 1 part by mole of Nb. If the Mn content exceeds 0.154 parts by mole per 1 part by mole of Nb, however, reliability remains high but displacement characteristics are reduced. It is therefore preferred that the quantity of Mn, if contained, be 0.154 parts by mole or less per 1 part by mole of Nb.

Reference Examples

In the present invention, described above, piezoelectric ceramic layers contain an element M1 (Nd and/or Dy) and an element M2 (Ga and/or Al) in an amount of 0.071 parts by mole or less per 1 part by mole of Nb besides the main ingredient thereof for improved reliability. The results of studies conducted by the inventors, however, have revealed that high reliability can also be achieved by dividing a piezoelectric ceramic body as the multilayer sintered body into superficial and non-superficial domains and making the molar quantities of Ga, Nd, and Dy in the superficial domain larger than those in the non-superficial domain.

The following describes the findings as reference examples.

Figure 4:
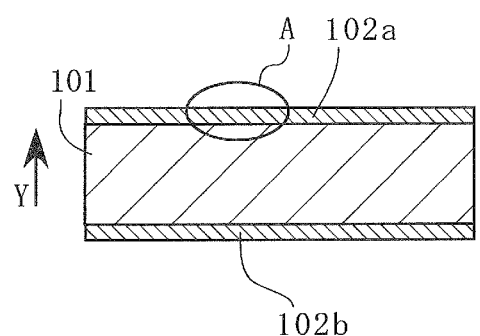
FIG. 4 is a cross-sectional view of a piezoelectric ceramic electronic component illustrating a reference example.

FIG. 4 is a cross-sectional diagram schematically illustrating a single-layer piezoelectric ceramic electronic component as a reference example.

This piezoelectric ceramic electronic component is composed of a piezoelectric ceramic body 101 and a pair of outer electrodes 102a and 102b on the principal faces thereof. When voltage is applied across the outer electrodes 102a and 102b, the piezoelectric ceramic electronic component is displaced in the direction of arrow Y.

As in the present invention, the piezoelectric ceramic body 101 contains a perovskite-structured alkali niobate compound as the main ingredient and also contains Ga and at least one element M3 of Nd and Dy as accessory ingredients.

Figure 5:
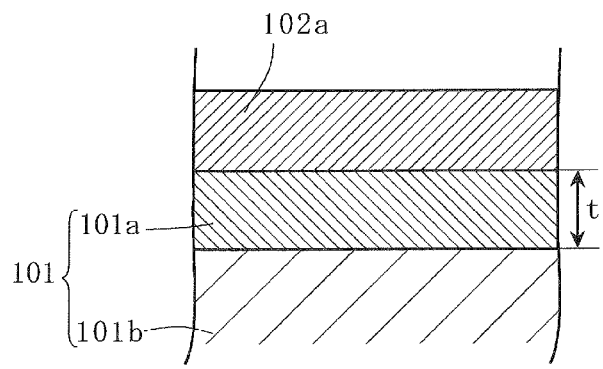
FIG. 5 is an enlarged cross-sectional view of portion A of FIG. 4.

FIG. 5 is an enlarged cross-sectional view of portion A, illustrating the vicinity of the interface between the outer electrode 102a and the piezoelectric ceramic body 101. The vicinity of the interface between the outer electrode 102b and the piezoelectric ceramic body 101, not illustrated, is similar to this.

To be more specific, the piezoelectric ceramic body 101 has a superficial domain 101a, a domain touching the outer electrode 102a and having a thickness t in the direction of thickness, and a non-superficial domain 101b, a domain left after excluding the superficial domain. In the superficial domain 101a, the total of Ga/Nb, Nd/Nb, and Dy/Nb ratios is higher than in the non-superficial domain 101b. This improves reliability without compromising good piezoelectricity.

The reason for this improvement of reliability without compromising good piezoelectricity should be as follows.

The piezoelectric ceramic body 101 is usually produced through the firing of a shaped article. When the main ingredient is an alkali niobate compound, the alkali metals contained in the alkali niobate compound evaporate from the surface of the shaped article during firing. This produces defects in the superficial domain 101a of the piezoelectric ceramic body 101 resulting from firing, seemingly causing a loss of reliability.

According to the results of studies conducted by the inventors, mixing an alkali niobate compound as the main ingredient with Ga and an element M3 (Nd and/or Dy) as accessory ingredients, followed by characteristics evaluation, improved reliability but at the same time caused a loss of piezoelectricity.

The inventors did further extensive research, and the research revealed that dividing the piezoelectric ceramic body 101 into a superficial domain 101a, a domain where surface defects as a cause of lowered reliability are likely to occur, and a non-superficial domain 101b, a domain where no surface defect occurs, and making the total of Ga/Nb, Nd/Nb, and Dy/Nb ratios in the superficial domain 101a higher than that in the non-superficial domain 101b improves reliability without loss of piezoelectricity because even after direct-current voltage is applied for a long period of time, the occurrence of surface defects is prevented in the superficial domain 101a while good piezoelectricity is maintained in the non-superficial domain 101b.

In summary, the piezoelectric ceramic body 101 contains a perovskite-structured alkali niobate compound as the main ingredient and also contains Ga and at least one element of Nd and Dy as accessory ingredients. The piezoelectric ceramic body 101 has a superficial domain 101a and a non-superficial domain 101b, a domain left after excluding the superficial domain 101a. In the superficial domain 101a, the total of Ga/Nb, Nd/Nb, and Dy/Nb ratios is higher than in the non-superficial domain 101b. This leads to high reliability without compromising good piezoelectricity. As a result, piezoelectricity and reliability are combined.

It would be preferred that the piezoelectric ceramic body 101 contain various ingredients for improved piezoelectricity and other purposes. For example, it would be preferred that the alkali niobate compound as the main ingredient be composed of $ANbO_3$ and an appropriate amount of a compound represented by a general formula $M2M4O_3$ (where M2 represents at least one of Ba, Ca, and Sr, and M4 represents at least one of Zr, Sn, and Hf) therein. This leads to a further improvement of piezoelectricity.

A piezoelectric ceramic electronic component according to this reference example can be easily manufactured as follows.

First, the following ceramic raw materials are prepared: alkali metal compounds, a Nb compound, a Ga compound, and an M3 compound containing an element M3, optionally with a Ba compound, a Zr compound, and so forth.

Predetermined amounts of the ceramic raw materials are then weighed out, and the apportioned materials are put into a ball mill containing a milling medium such as PSZ (partially stabilized zirconia) balls and thoroughly wet-milled in the presence of a solvent such as ethanol to form a mixture.

The mixture is dried and then calcined for synthesis at 850° C. to 900° C. This yields calcined material.

The calcined material is disintegrated and wet-mixed in a ball mill with an organic binder and a dispersant in the presence of a solvent such as purified water, forming ceramic slurry. The ceramic slurry is shaped into first ceramic green sheets 103 as illustrated in FIG. 6 using a doctor blade or any similar method in such a manner that the post-firing thickness t will be, for example, 120 μm.

Figure 6:
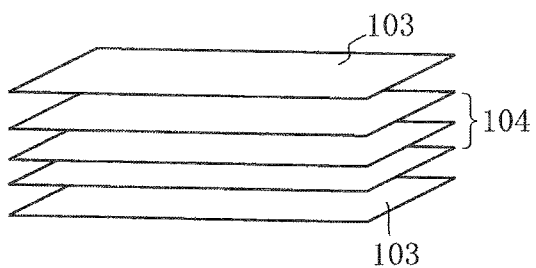
FIG. 6 is an exploded perspective view of a multilayer article obtained in the course of manufacturing a piezoelectric ceramic electronic component according to the aforementioned reference example.

Then second ceramic green sheets 104 as illustrated in FIG. 6 are produced in such a manner that the post-firing thickness t will be, for example, 120 μm. The process and procedure are the same as in the production of the first ceramic green sheets 103, except that the ceramic raw materials were weighed out in such a manner that the total of Ga/Nb and M3/Nb ratios would be smaller than in the first ceramic green sheets 103.

A predetermined number of second ceramic green sheets 104 are then stacked, and the stacked second ceramic green sheets 104 are held between the first ceramic green sheets 103 and pressure-bonded. This produces a multilayer article whose outermost layers are the first ceramic green sheets 103.

The multilayer article is cut into a predetermined size, and the workpiece is placed in a sagger made of alumina. After debinding at 250° C. to 500° C., the workpiece is fired at 1000° C. to 1100° C. in a reducing atmosphere. Through this, a piezoelectric ceramic body (multilayer sintered body) 101 is formed.

A conductive paste for outer electrodes, a paste of Ag or similar, is then applied to the surface of the piezoelectric ceramic body 101 and fired at 750° C. to 850° C. to form outer electrodes 102a and 102b, followed by a predetermined poling process. In this way, a piezoelectric ceramic electronic component is manufactured. The outer electrodes 102a and 102b only need to be in close contact and may be formed using a thin-film formation method such as sputtering or vacuum deposition.

The following describes a multilayer piezoelectric ceramic electronic component as another reference example.

Figure 7:
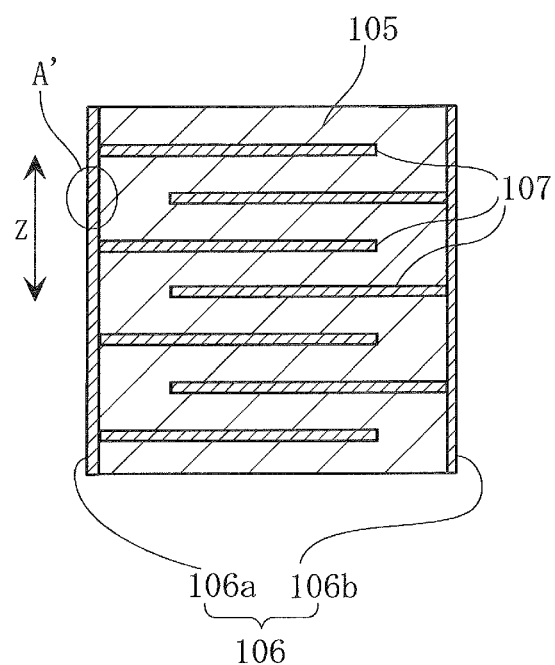
FIG. 7 is a cross-sectional view of a piezoelectric ceramic electronic component according to another reference example.

FIG. 7 is a cross-sectional diagram schematically illustrating a multilayer piezoelectric ceramic electronic component as this second reference example.

Substantially like one according to the present invention (see FIG. 1), this multilayer piezoelectric ceramic electronic component includes a multilayer sintered body 105 and outer electrodes 106a and 106b made of a conductive material such as Ag on the end portions of the multilayer sintered body 105. The multilayer sintered body 105 is an alternate stack of piezoelectric ceramic layers as a sintered form of ceramic green sheets and inner electrodes 107 made of a Ni-based conductive material.

In this second reference example, too, the multilayer sintered body 105 contains a perovskite-structured alkali niobate compound as the main ingredient and also contains Ga and at least one element M of Nd and Dy as accessory ingredients.

Substantially as in FIG. 5 for the first reference example, the multilayer sintered body 105 in FIG. 7 has superficial and non-superficial domains in portion A'. In the superficial domain, the total of Ga/Nb, Nd/Nb, and Dy/Nb ratios is higher than in the non-superficial domain. As in the first reference example, this improves reliability without compromising good piezoelectricity.

In this second reference example, the inner electrodes are made of a Ni-based material with the aim of low-cost prevention of electrochemical migration, and firing in a reducing atmosphere is therefore needed. For this purpose, it is desirable that Mn and Zr be contained as accessory ingredients for improved sinterability in a reducing atmosphere.

The process and procedure for producing this multilayer piezoelectric ceramic electronic component are the same as in the present invention, except for the difference in constitution between the superficial and non-superficial domains (see FIGS. 2 and 3).

In summary, this second reference example, like the present invention, provides a highly reliable multilayer piezoelectric ceramic electronic component despite cofiring with a Ni-based inner electrode material in a reducing atmosphere.

[Experiment]

For the multilayer piezoelectric ceramic electronic component illustrated in the second reference example, samples were produced and evaluated for their characteristics. The following is a specific description of this illustrative experiment.

[Production of Samples]

(Production of Ceramic Green Sheets)

First, the following ceramic raw materials were prepared: $K_2CO_3$, $Na_2CO_3$, $Nb_2O_5$, $BaCO_3$, and $ZrO_2$. The ceramic raw materials were then weighed out to the compositional formula $[100\{0.95(K_{0.5}Na_{0.5})NbO_3\text{-}0.05BaZrO_3\}+0.5ZrO_2]$. The apportioned materials were put into a ball mill containing PSZ balls and wet-mixed with ethanol as solvent for approximately 90 hours. The obtained mixture was dried and then calcined for synthesis at a temperature of 850° C. in an air atmosphere. This yielded calcined material.

Then the following ceramic raw materials were prepared: $MnCO_3$, $Ga_2O_3$, $Nd_2O_3$, and $Dy_2O_3$. $MnCO_3$ was added to the calcined material to make 0.05 parts by mole per 1 part by mole of the calcined material, and $Ga_2O_3$, $Nd_2O_3$, and $Dy_2O_3$ were added in such amounts that the molar quantities of Ga, Nd, and Dy per 1 part by mole of the calcined material would be the numbers of parts by moles specified in Table 3. The materials were then milled to form a mixture.

The mixture was put into a ball mill together with a binder, a dispersant, and purified water and thoroughly wet-mixed with them. The obtained material was shaped using a doctor blade into 120-μm-thick ceramic green sheets. In this way, a predetermined number of ceramic green sheets were produced for sample numbers A to F.

Table 3 summarizes the molar quantities of Ga, Nd, and Dy per 1 part by mole of calcined material in the ceramic green sheets for sample numbers A to F.

TABLE 3

| | Molar quantity per 1 part by mole of calcined material (parts by mole) | | |
|---|---|---|---|
| Sample No. | Ga | Nd | Dy |
| A | 0 | 0 | 0 |
| B | 0.005 | 0 | 0.005 |
| C | 0.01 | 0 | 0 |
| D | 0 | 0 | 0.01 |
| E | 0.01 | 0.01 | 0 |
| F | 0.01 | 0 | 0.01 |

(Production of Test Samples)

A Ni-based conductive paste was prepared, and the conductive paste was applied to some of the ceramic green sheets using screen printing to form conductive films in a predetermined pattern.

Then selected ones of ceramic green sheets A to F were stacked into a multilayer article in such a manner as to make the combination specified in Table 4 for the ceramic green sheets in the superficial domain and those in the non-superficial domain.

Table 4 summarizes the combinations of ceramic green sheets A to F in the superficial and non-superficial domains for sample numbers 101 to 107. The number of layers was 11.

TABLE 4

| Sample No. | Superficial domain | Non-superficial domain |
|---|---|---|
| 101 | F | A |
| 102 | E | A |
| 103 | F | C |
| 104 | F | D |
| 105 | F | B |
| 106 | F | F |
| 107 | A | A |

The multilayer article was pressed with a pressure of 25 MPa for pressure bonding and then fired at a temperature of approximately 1000° C. to 1080° C. for 2 hours in a reducing atmosphere in which the oxidation of Ni was inhibited. In this way, a multilayer sintered body was produced in which inner electrodes were embedded.

The piezoelectric ceramic body was cut using a dicer in such a manner as to make the inner electrodes exposed alternately on each end face of the multilayer sintered body. A Ni—Cr alloy and Ni—Cu alloy bilayer outer electrode was then formed on each end face using sputtering, and the resulting workpiece was subjected to a poling process in which it was exposed to an electric field of 3.0 kV/mm for 10 minutes at room temperature. In this way, samples of sample numbers 101 to 107 were obtained. The outer dimensions of each sample were 8.0 mm long, 2.0 mm wide, and 1.0 mm thick.

[Evaluation of the Samples]

Each of the samples of sample numbers 101 to 107 was partially polished to mirror finish. The chemical constitution was analyzed at five points each within 5 μm in the superficial portion and within 5 μm in the middle portion using an FE-WDX (field-emission wavelength-dispersive X-ray diffractometer), and the mean Ga/Nb, Nd/Nb, and Dy/Nb ratios were determined.

For each of the samples of sample numbers 101 to 107, the lateral displacement S of the device was measured using a laser Doppler vibrometer with electric fields from 0.5 to 11 kV/mm and at a measurement frequency of 1 kHz. The displacement S was divided by the width of the device (2 mm) to give the strain, which was then divided by the electric fields E to give S/E values. The maximum S/E value, Smax/Emax, was used to evaluate displacement characteristics.

Furthermore, each of the samples of sample numbers 101 to 107 was put into a temperature-controlled bath at 85° C. and exposed to a DC electric field of 2 kV/mm. At the time points of 1 hour, 24 hours, 100 hours, 200 hours, 300 hours, 400 hours, and 500 hours, the sample was taken out of the bath and the specific resistance was measured. The time point at which the specific resistance became $10^3$ Ω·cm or less was defined as the DC electric-field reliability life.

Table 5 summarizes the Ga/Nb, Nd/Nb, and Dy/Nb ratios (means) in the superficial and middle portions, the Smax/Emax, and the reliability life for sample numbers 101 to 107.

TABLE 5

| Sample No. | Superficial domain | | | Non-superficial domain | | | $S_{max}/E_{max}$ (pm/V) | Reliability life (h) |
| --- | --- | --- | --- | --- | --- | --- | --- | --- |
| | Ga/Nb ratio (—) | Nd/Nb ratio (—) | Dy/Nb ratio (—) | Ga/Nb ratio (—) | Nd/Nb ratio (—) | Dy/Nb ratio (—) | | |
| 101 | 0.010 | 0.000 | 0.010 | 0.000 | 0.000 | 0.000 | 105 | 500 |
| 102 | 0.010 | 0.010 | 0.000 | 0.000 | 0.000 | 0.000 | 107 | 500 |
| 103 | 0.010 | 0.000 | 0.010 | 0.010 | 0.000 | 0.000 | 94 | 400 |
| 104 | 0.010 | 0.000 | 0.010 | 0.000 | 0.000 | 0.010 | 92 | 400 |
| 105 | 0.010 | 0.000 | 0.010 | 0.005 | 0.000 | 0.005 | 80 | 400 |
| 106 | 0.010 | 0.000 | 0.010 | 0.010 | 0.000 | 0.010 | 60 | 500 |
| 107 | 0.000 | 0.000 | 0.000 | 0.000 | 0.000 | 0.000 | 120 | 24 |

For sample number 107, the superficial domain did not contain Ga, Nd, or Dy. The Smax/Emax was satisfactory, 120 µm/V, but the reliability life was as short as 24 hours, indicating low reliability.

For sample number 106, the superficial domain contained Ga and Dy, but the total of Ga/Nb and Dy/Nb ratios was equal to that in the non-superficial domain. There was no substantial difference in concentration between the superficial and non-superficial domains. The reliability life was satisfactory, 500 hours, but the Smax/Emax was as low as 60 µm/V, indicating poor displacement characteristics.

For sample numbers 101 to 105, the total of Ga/Nb, Nd/Nb, and Dy/Nb ratios in the superficial domain was higher than that in the non-superficial domain. As a result, the Smax/Emax was from 80 to 107 µm/V indicating good displacement characteristics, and likewise the reliability life was from 400 to 500 hours indicating high reliability.

REFERENCE SIGNS LIST

1 Multilayer sintered body
2a, 2b Outer electrodes
3a to 3g Inner electrodes

The invention claimed is:

1. A multilayer piezoelectric ceramic electronic component comprising:
   a multilayer sintered body composed of alternately stacked Ni-based electrodes and piezoelectric ceramic layers,
   the piezoelectric ceramic layers comprising a main ingredient of a perovskite compound containing Nb, K, Na, and Li, at least one element M1 selected from Nd and Dy, and at least one element M2 selected from Ga and Al, and
   a content of the element M2 is 0.071 parts by mole or less per 1 part by mole of the Nb.

2. The multilayer piezoelectric ceramic electronic component according to claim 1, wherein the content of the element M2 is measured in a solution obtained through a dissolution process.

3. The multilayer piezoelectric ceramic electronic component according to claim 1, further comprising outer electrodes on a surface of the multilayer sintered body.

4. The multilayer piezoelectric ceramic electronic component according to claim 1, wherein the content of the element M2 is 0.002 parts by mole or more per 1 part by mole of the Nb.

5. The multilayer piezoelectric ceramic electronic component according to claim 1, wherein a content of the element M1 is 0.002 parts by mole or more and 0.071 parts by mole or less per 1 part by mole of the Nb.

6. The multilayer piezoelectric ceramic electronic component according to claim 1, wherein:
   the piezoelectric ceramic layers contain Mn; and
   a content of the Mn is 0.154 parts by mole or less per 1 part by mole of the Nb.

7. The multilayer piezoelectric ceramic electronic component according to claim 1, wherein:
   the piezoelectric ceramic layers contain Ba; and
   a Ba content is 0.063 parts by mole or less per 1 part by mole of the Nb.

8. The multilayer piezoelectric ceramic electronic component according to claim 1, wherein:
   the piezoelectric ceramic layers contain Zr; and
   a Zr content is 0.088 parts by mole or less per 1 part by mole of the Nb.

9. A multilayer piezoelectric ceramic electronic component comprising:
   a multilayer sintered body composed of alternately stacked Ni-based electrodes and piezoelectric ceramic layers,
   the multilayer sintered body comprising a main ingredient of a perovskite compound containing Nb, K, Na, and Li, at least one element M1 selected from Nd and Dy, and at least one element M2 selected from Ga and Al, and
   a content of the element M2 is 0.071 parts by mole or less per 1 part by mole of the Nb in the multilayer sintered body.

10. The multilayer piezoelectric ceramic electronic component according to claim 9, further comprising outer electrodes on a surface of the multilayer sintered body.

11. The multilayer piezoelectric ceramic electronic component according to claim 9, wherein the content of the element M2 is 0.002 parts by mole or more per 1 part by mole of the Nb.

12. The multilayer piezoelectric ceramic electronic component according to claim 9, wherein a content of the element M1 is 0.002 parts by mole or more and 0.071 parts by mole or less per 1 part by mole of the Nb.

13. The multilayer piezoelectric ceramic electronic component according to claim 9, wherein:
   the piezoelectric ceramic layers contain Mn; and
   a Mn content is 0.154 parts by mole or less per 1 part by mole of the Nb.

14. The multilayer piezoelectric ceramic electronic component according to claim 9, wherein:
   the piezoelectric ceramic layers contain Ba; and
   a Ba content is 0.063 parts by mole or less per 1 part by mole of the Nb.

15. The multilayer piezoelectric ceramic electronic component according to claim 9, wherein:
   the piezoelectric ceramic layers contain Zr; and
   a Zr content is 0.088 parts by mole or less per 1 part by mole of the Nb.

16. A method for manufacturing a multilayer piezoelectric ceramic electronic component, the method comprising:

preparing ceramic raw materials including a Na compound, a K compound, a Li compound, a Nb compound, at least one compound selected from a Nd compound and a Dy compound, and at least one compound selected from a Ga compound and an Al compound and weighing out such amounts of the ceramic raw materials that a post-firing quantity of at least one element of Ga and Al will be 0.071 parts by mole or less per 1 part by mole of Nb;

producing ceramic green sheets from the ceramic raw materials;

applying a Ni-based conductive paste to the ceramic green sheets to form conductive films in a predetermined pattern;

stacking the ceramic green sheets, with the conductive films thereon, in a predetermined order to produce a multilayer article; and firing the multilayer article in a reducing atmosphere to produce a multilayer sintered body.

17. The method for manufacturing a multilayer piezoelectric ceramic electronic component according to claim 16, further comprising forming outer electrodes on a surface of the multilayer sintered body.

18. The method for manufacturing a multilayer piezoelectric ceramic electronic component according to claim 16, wherein the ceramic raw materials are weighed out such that the post-firing quantity of the at least one element of Ga and Al will be 0.002 parts by mole or more per 1 part by mole of the Nb.

19. The method for manufacturing a multilayer piezoelectric ceramic electronic component according to claim 16, wherein the ceramic raw materials are weighed out such that a post-firing quantity of at least one element of Nd and Dy will be 0.002 parts by mole or more and 0.071 parts by mole or less per 1 part by mole of the Nb.

* * * * *